(12) United States Patent
Shtargot et al.

(10) Patent No.: US 8,475,214 B2
(45) Date of Patent: Jul. 2, 2013

(54) ADAPTOR FOR A ROUTER BLADE

(75) Inventors: Helen Shtargot, Foster City, CA (US);
Robert Arthur Loose, Cary, NC (US);
Phong Hoang Ho, Cary, NC (US);
Dattatri Mattur, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 13/295,903

(22) Filed: Nov. 14, 2011

(65) Prior Publication Data
US 2012/0057286 A1 Mar. 8, 2012

Related U.S. Application Data

(63) Continuation of application No. 12/333,790, filed on Dec. 12, 2008, now Pat. No. 8,070,522.

(51) Int. Cl.
*H01R 25/00* (2006.01)
*H01R 27/02* (2006.01)
*H01R 31/00* (2006.01)
*H01R 33/88* (2006.01)
*H01R 33/90* (2006.01)
*H01R 33/92* (2006.01)
*H01R 33/94* (2006.01)

(52) U.S. Cl.
USPC ..................................... 439/638; 361/679.39

(58) Field of Classification Search
USPC .................. 439/638, 946, 945; 361/725, 727, 361/679.39
See application file for complete search history.

(56) References Cited

U.S. PATENT DOCUMENTS

| | | | |
|---|---|---|---|
| 5,155,663 A | 10/1992 | Harase | |
| 5,457,601 A | 10/1995 | Georgopulos et al. | |
| 5,808,867 A * | 9/1998 | Wang | 361/695 |
| 6,050,848 A | 4/2000 | Yao | |
| 6,164,989 A | 12/2000 | Glad et al. | |
| 6,174,205 B1 | 1/2001 | Madsen et al. | |
| 6,203,378 B1 | 3/2001 | Shobara et al. | |
| 6,224,391 B1 | 5/2001 | Horie et al. | |
| 6,264,506 B1 | 7/2001 | Yasufuku et al. | |
| 6,408,352 B1 | 6/2002 | Hosaka et al. | |
| 6,456,491 B1 | 9/2002 | Flannery et al. | |
| 6,457,647 B1 | 10/2002 | Kurihashi et al. | |
| 6,549,400 B1 * | 4/2003 | Medin et al. | 361/679.41 |
| 6,736,678 B2 | 5/2004 | Yao | |
| 6,856,508 B2 * | 2/2005 | Rabinovitz | 361/679.31 |
| 7,059,913 B1 | 6/2006 | Chen | |
| 7,200,678 B1 | 4/2007 | Bettadahalli et al. | |
| 7,684,208 B2 * | 3/2010 | Okamoto et al. | 361/798 |
| 7,765,347 B2 * | 7/2010 | King et al. | 710/100 |
| 7,821,790 B2 * | 10/2010 | Sharma et al. | 361/727 |
| 2005/0114474 A1 | 5/2005 | Anderson et al. | |
| 2011/0090633 A1 * | 4/2011 | Rabinovitz | 361/679.31 |

* cited by examiner

*Primary Examiner* — Hae Moon Hyeon
(74) *Attorney, Agent, or Firm* — Brinks Hofer Gilson & Lione

(57) ABSTRACT

An apparatus for connecting a router blade to a router chassis is provided. The apparatus includes an engagement portion; a first side portion coupled with the engagement portion; and a second side portion coupled with the engagement portion. The engagement portion includes a connector system that is operable to couple a router blade with a router chassis. The first side portion is operable to engage the router blade and the router chassis. The second side portion is operable to engage a router blade and the router chassis. The engagement portion, first side portion, and second side portion are sized to engage the router chassis and receive the router blade.

20 Claims, 8 Drawing Sheets

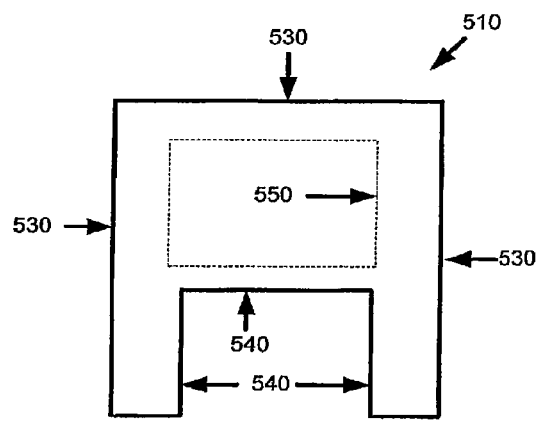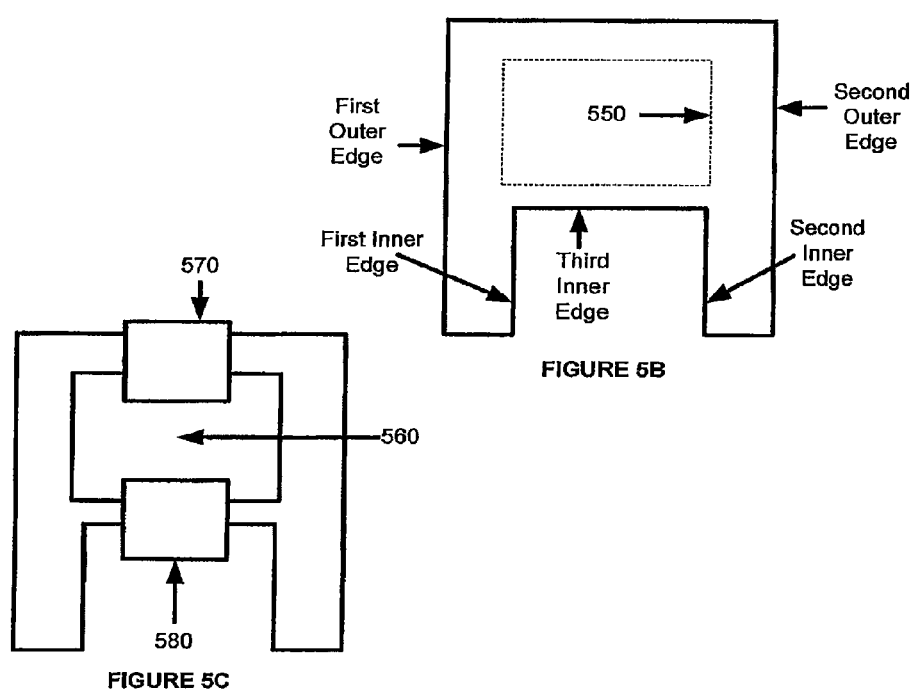

ADAPTOR FOR A ROUTER BLADE

CROSS-REFERENCE TO RELATED APPLICATIONS

This application is a continuation application of U.S. patent application Ser. No. 12/333,790, filed Dec. 12, 2008, which is hereby incorporated by reference in its entirety.

FIELD OF TECHNOLOGY

The present embodiments relate to an adaptor for a router blade; and more specifically, an adaptor that couples a router blade with a network router.

BACKGROUND OF TECHNOLOGY

A network router may provide service to a network. Service may include, for example, routing, caching, voicemail, and security. The hardware and/or software that provide the service may be disposed on network blades, which may be connected to the router. A network administrator may add and/or remove one or more network blades to customize the service provided by the router.

The service blade may be inserted into a network chassis of the network router. The network chassis is sized to receive the network blade. As network router technology has developed, the size of the network chassis has increased to accommodate larger network blades. For example, the width of the network chassis has increased to accommodate wider network blades. However, the old service blades, which were sized for the older network chassis, no longer fit into the network chassis.

BRIEF DESCRIPTION OF THE DRAWINGS

The system and method may be better understood with reference to the following drawings and description. Non-limiting and non-exhaustive embodiments are described with reference to the following drawings. The components in the drawings are not necessarily to scale, emphasis instead being placed upon illustrating the principles of the invention. In the drawings, like referenced numerals designate corresponding parts throughout the different views.

FIGS. 5A, 5B, and 5C illustrate another embodiment of an adaptor;

DETAILED DESCRIPTION

Figure 1:
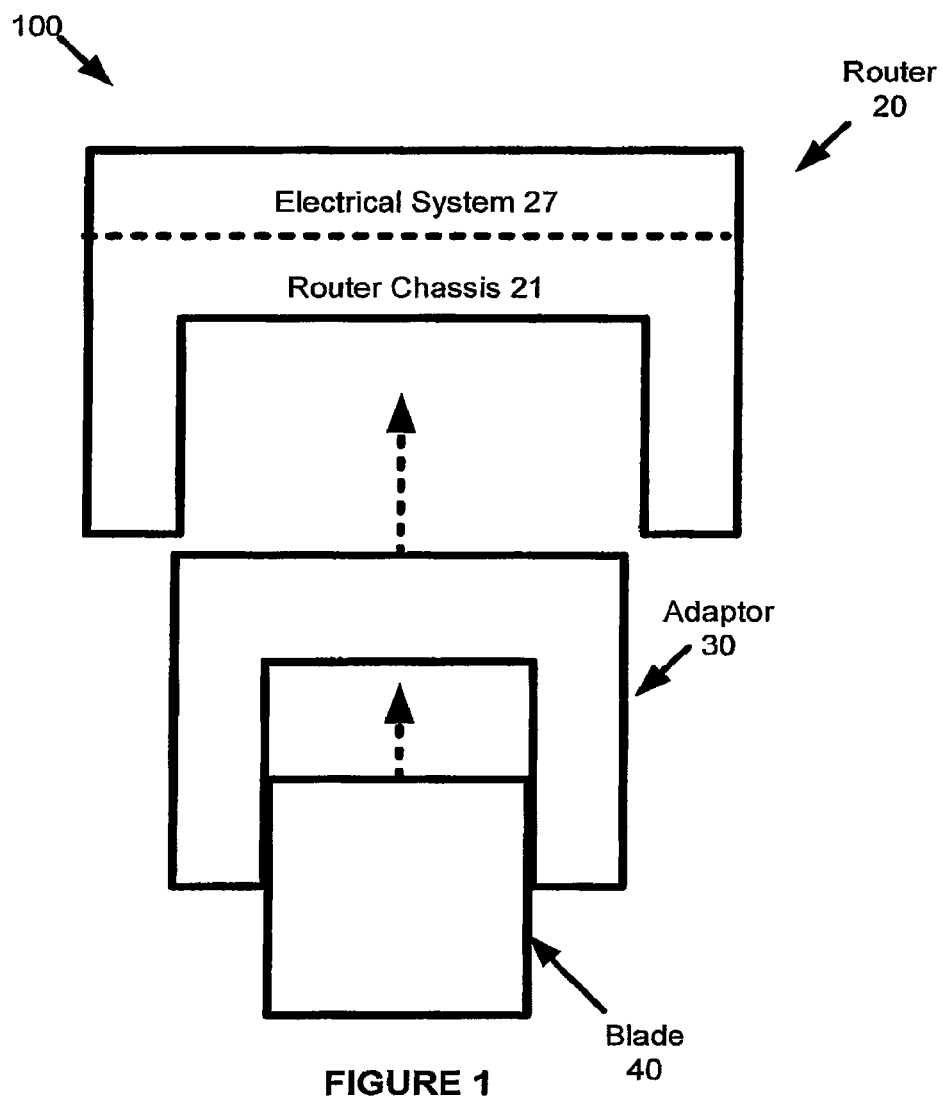
FIG. 1 illustrates one embodiment of a connection system.

The present embodiments relate to an adaptor for a router blade. The adaptor is sized to receive the router blade, such that the router blade may be plugged into the adaptor. The adaptor is sized to engage a router chassis. The adaptor may be connected to the router chassis. The adaptor is operable to mechanically connect the network blade to the network chassis and is operable to electrically connect a blade circuit to a router circuit. The adaptor is operable to engage with the network blade and the router chassis. As used herein, "engaged with" includes brought together and interlocked. Interlocked includes connected so that the motion or operation of a part is constrained by another part. The adaptor couples the router blade with the network router. Although described herein as an adaptor for a router blade, the adaptor may be used for any other router or non-router device. For example, the adaptor may be used for adapting a network card to a specific size network slot.

The embodiments described below include systems, apparatuses, and methods for coupling a router blade with a network router. In one embodiment, an apparatus includes a connection portion, a first side portion, and a second side portion. The connection portion includes a connector system that is operable to couple a router blade with a router chassis. The first side portion is coupled with the connection portion and is operable to engage the router blade and the router chassis. The second side portion is coupled with the connection portion and is operable to engage a router blade and the router chassis. The connection portion, the first side portion, and the second side portion are sized to engage the router chassis and receive the router blade.

In one method, a connection area of an adaptor is formed. The connection area is sized to receive a connector that couples a router chassis with a router blade. The method includes forming a chassis side of the adaptor. The chassis side is sized to engage the router chassis. The method includes forming a blade side of the adaptor. The blade side is sized to engage a router blade.

In one embodiment, an adaptor includes an extension portion that is sized to engage a router chassis and receive a router blade; and a connector system coupled with the extension portion, the connector system being operable to electrically couple the router chassis with the router blade. The extension portion is operable to couple the router blade with the router chassis.

In one illustration, which will be referred to herein as "the above illustration," an original router provides service to a network. An original service blade is connected to a router chassis of the original router. The original service blade delivers functionalities, such as Voice over Internet Protocol (VoIP)/Voice over Asynchronous Transfer Mode (VoATM) services. The router chassis includes two chassis guides, which guide the original service blade as the original service blade is plugged into the router chassis. The router chassis has a distance of six (6) inches between two chassis guides. The original service blade is sized to engage the two chassis guides. Accordingly, the original service blade has a width of approximately six (6) inches. A replacement router has two chassis guides, which are spaced apart by ten (10) inches. Accordingly, the replacement router is not sized to receive the original service blade. The original service blade does not engage the replacement router's two chassis guides. The replacement router's chassis is too large to engage the original service blade. In addition, the connectors from the original service blade to the replacement router's connectors may not match.

The original service blade may be connected to (e.g., plugged into) an adaptor according to the disclosed embodiments. The adaptor is sized to fit into the replacement router's chassis (e.g., has a total width of approximately 10 inches). The adaptor is sized to receive the original service blade (e.g., has a receiving area that has a width of 6 inches). The adaptor and original service blade are connected to the replacement router's chassis. The adaptor electrically connects the original service blade to the router and allows the original service blade to engage the replacement router's chassis and provide VoIP/VoATM functionalities to the network.

FIG. 1 illustrates one embodiment of a system 100 for connecting a network blade to a network router. The system 100 includes a router 20, an adaptor 30, and a blade 40. The router 20 may be periodically or continuously coupled with the adaptor 30. The adaptor 30 may be periodically or continuously coupled with the network blade 40. Herein, the phrases "coupled with" and "coupling with" include a direct connection to or an indirect connection through one or more intermediate components. Such intermediate components may include both hardware and software based components. In alternative embodiments, the system 100 may include additional, different, or fewer components.

The system 100 is a connection system, a router system, a blade assembly, module connector system, electrical connection system, adaptor device, sizing system, extension system, or other system for coupling a network router with a network blade. For example, the system 100 may be a blade assembly that mechanically and/or electrically connects the network blade 40 to the router 20. The blade assembly may be sized to receive the network blade 40 and sized to engage the router 20. In another example, the system 100 is an extension system that extends the width of the blade 40, such that the blade 40 may be indirectly engaged with a router 20.

The router 20 includes a chassis 21 and an electrical system 27. Additional, different, or fewer components may be provided. For example, the router 20 may include a plurality of chassis' 21 and/or a plurality of electrical systems 27. The router 20 may be a chassis based system, enterprise router, residential gateway, router device, or other system for providing router services. In the illustration above, the replacement router and original router are routers 20.

Figure 2A:
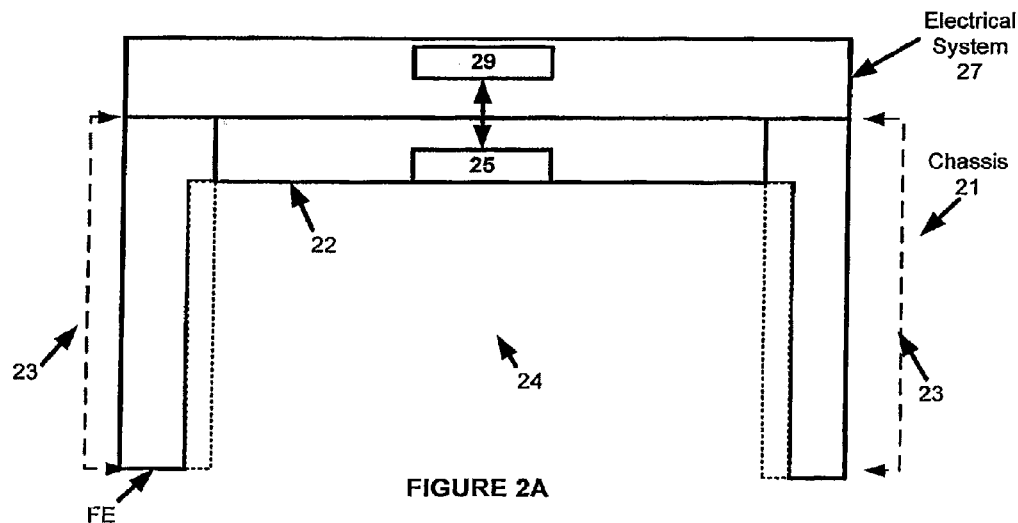
FIG. 2A illustrate one embodiment of a router chassis.

As shown in FIG. 2A, the chassis 21 includes a docking portion 22, one or more chassis side portions 23, and a receiving area 24. Additional, different, or fewer components may be provided. For example, the chassis may include a cover, handle, top plate, and/or bottom plate.

The chassis 21 is a slot in the router 20, a shelf, a rack mount, a docking station, a device for mounting blades 40, receiving station, a device that receives properly sized adaptors 30 or blades 40, or a combination thereof. For example, the chassis 21 may be a rigid framework that supports or mounts a motherboard, memory, adaptor, disk drive, blade, module, other mountable equipment, or a combination thereof. In another example, the chassis 21 may be a shell-like case, such as a housing, that is sized to receive a properly sized adaptor 30 and/or blade 40. In another example, properly sized adaptors 30 and/or network blades 40 may be plugged into the chassis 21.

The docking portion 22 may include a connector 25. The connecter 25 may be coupled with the one or more electrical components 29 of the electrical system 27 using a wire, wireless device, circuit, or coupling device. The docking area 22 may include additional, different, or fewer components. The docking portion may be an engagement area, a connection portion, a receiving portion, or other portion of the router that is operable to receive a properly sized adaptor 30 and/or blade 40.

The docking portion 22 may be coupled with or integrated with the router 20. The docking portion 22 is perpendicular to, adjacent to, or angled from the one or more side areas 23. As shown in FIG. 1, the docking portion 22 and the one or more side areas 23 form a "U" shape. The docking portion 22 and one or more side areas 23 may surround, define, or be adjacent to the receiving area 24. Alternatively, or in addition to, the docking portion 22 and the one or more side areas 23 may form other shapes, such as an "L" shape or octagon shape.

The docking portion 22 and/or one or more side areas 23 may include conductive material, such as a metal. The conductive material may be used to ground or electrically connect the chassis 21 to the adaptor 30 when the adaptor 30 is engaged with the chassis 21. Alternatively, or in addition to, the docking portion 22 and/or one or more side areas 23 may include a non-conductive material, such as plastic.

The connector 25 may be a male, female, or neutral component. The connector 25 may engage with and/or connect to one or more connectors, such as the connector 38 of the adaptor 30. For example, the connector 25 may electrically connect the electrical components 29 of the electrical system 27 to the connector 38 of the adaptor 30. Alternatively, or in addition to, the side areas 23 and/or other portion of the router 20 may include the connector 25 and/or electrical components 29.

The one or more chassis side areas 23 may include one or more chassis guides 26. The one or more chassis guides 26 may support or engage the adaptor 30. For example, a chassis guide 26 may engage an outer adaptor guide 35. The one or more chassis guides 26 may be male, female, or neutral components. For example, the chassis guide 26 may be a female component that receives a male outer adaptor guide 35. Alternatively, a first chassis guide 26 may be a male component and a second chassis guide 26 may be a female component. In the illustration above, the two chassis guides for the replacement router are chassis guides 26.

Figure 3:
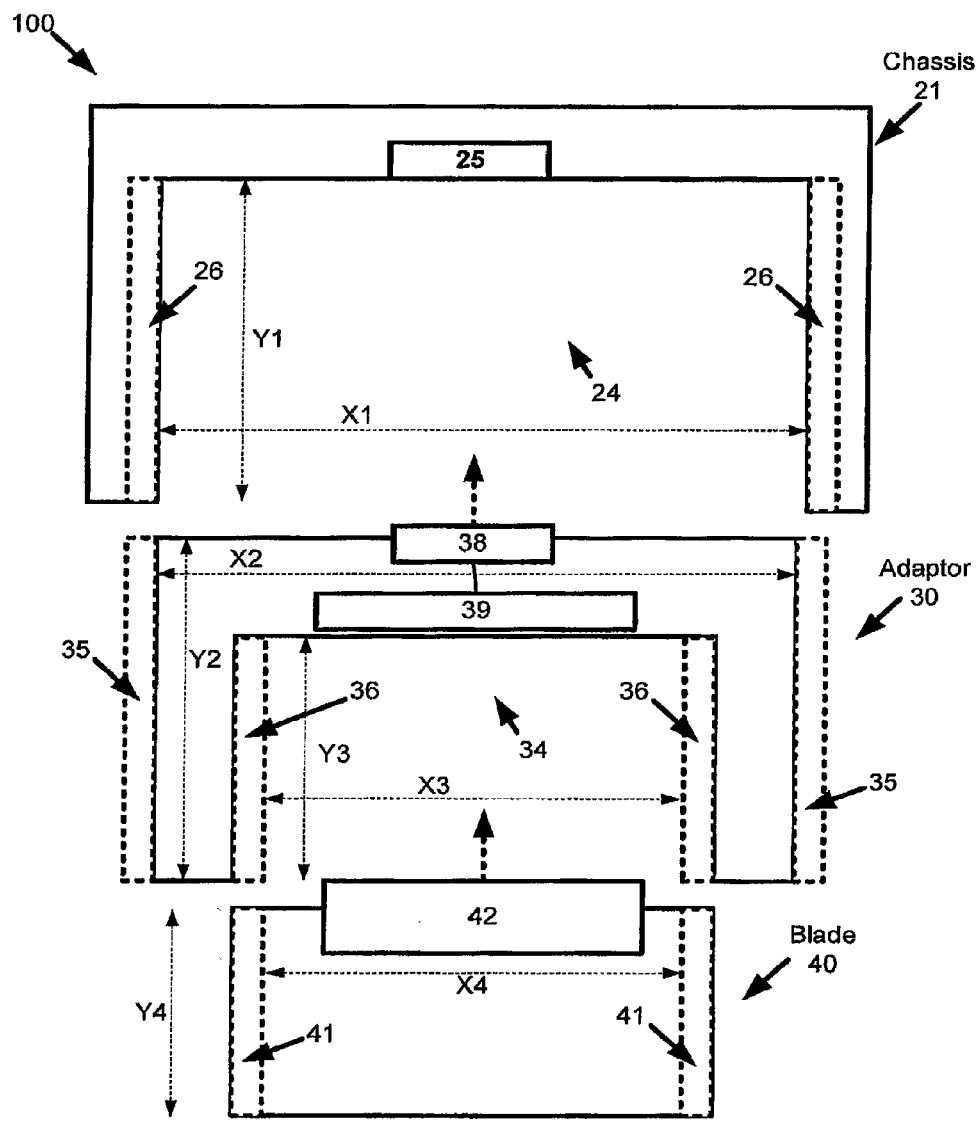
FIG. 3 illustrates another embodiment of a connection system.

The chassis receiving area 24 is operable to receive a properly sized adaptor 30 and/or blade 40. For example, the receiving area 24 may be sized to receive a properly sized adaptor 30 or blade 40. As used herein, "sized to receive" includes sized to interlock zero, one, two, or more side areas 33 and/or portions of the docking portion 32. For example, as shown in FIG. 3, the width of the chassis receiving area 24 (e.g., distance X1) may be sized so that at least one chassis guide 26 engages with at least one outer adaptor guide 35 (e.g., distance X1 is equal to or approximately equal to X2). The height of the receiving area 24 (e.g, distance Y1) may be sized so that a front end (FE) of the chassis 21 is flush or almost flush with a front end (FE) of the adaptor 30 (e.g., distance Y1 is equal to or approximately equal to Y2). In the illustration above, the width of the chassis is the distance between the two chassis guides, which is the width of the receiving area 24.

Figure 4:
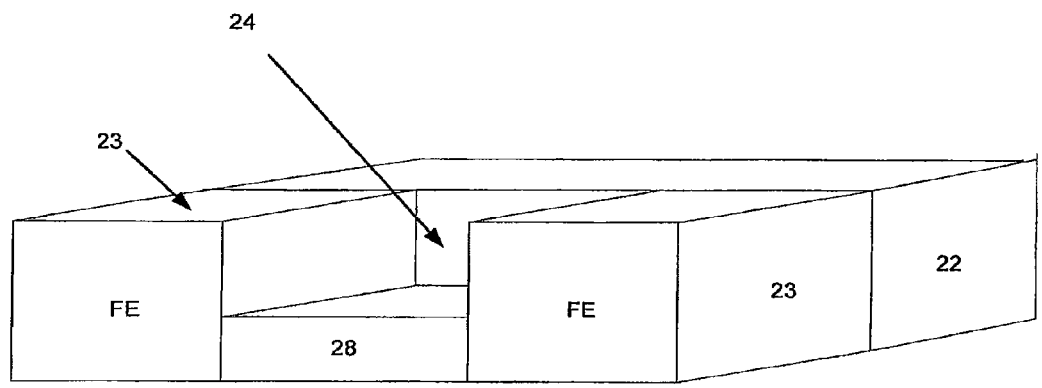
FIG. 4 illustrates one embodiment of a router chassis.

The chassis receiving area 24 may include an opening that allows an adaptor 30 and/or a blade 40 to enter into the receiving area 24. The opening may be across from, adjacent to, on top of, below, or integrated with the docking portion 22. The opening may be unobstructed, partially obstructed, or enclosed. For example, as shown in FIG. 4, the receiving area 24 may include a receiving support 28 that partially blocks the opening. In another example, the chassis receiving area 24 may include a door that encloses the chassis receiving area 24. The door may be opened (e.g., when inserting or removing an adaptor 30 and/or blade 40) and/or closed (e.g., once the adaptor 30 and/or blade 40 are inserted or removed).

Figure 2B:
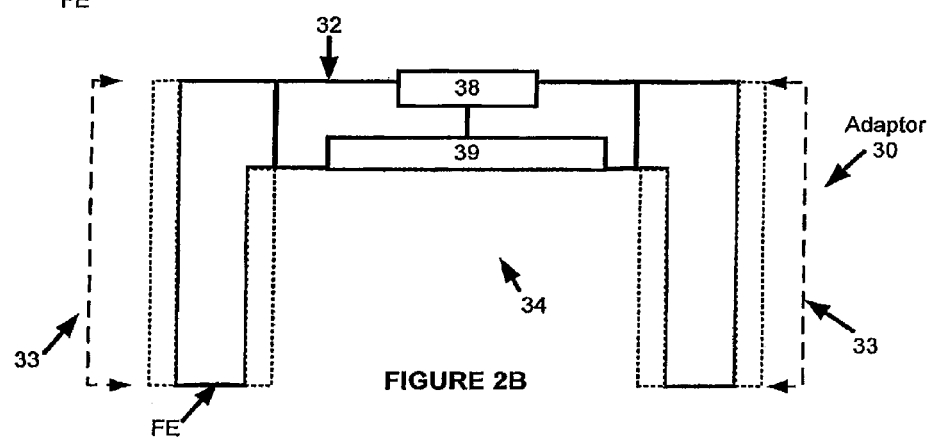
FIG. 2B illustrates one embodiment of an adaptor.
Figure 7:
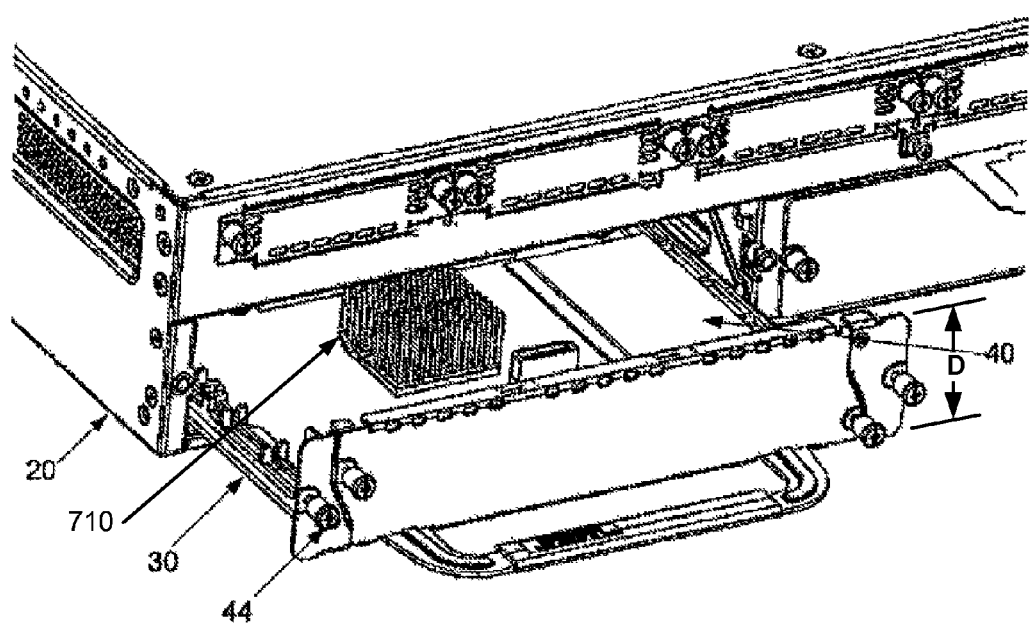
FIG. 7 illustrates another embodiment of a connection system.

As shown in FIG. 2B, the adaptor 30 includes a connection portion 32, one or more adaptor side areas 33, and an adaptor receiving area 34. Additional, different, or fewer components may be provided. For example, as shown in FIG. 7, the adaptor 30 may include screws 44 that connect the blade 40 to the adaptor 30. The screws 44 may be disposed on or around the front end (FE) of the one or more adaptor side areas 33. In another example, the adaptor 30 may include a connection light. The connection light may indicate when a blade 40 is electrically connected to the router 20. Also as shown in FIG. 7, the blade 40 may include a printed circuit board having a component 710 mounted thereon. The component 710 may extend from the printed circuit board to a height less than a height "D" of the front end of the adaptor 30.

The adaptor 30 is a connector that may match the physical and/or electrical characteristics of the router 20 and blade 40 so that a connection may be made between the router 20 and blade 40. The adaptor 30 may connect the router 20 and blade 40 with or without changing the electrical signals that pass between the router and the blade 40. For example, the adaptor 30 may include an electrical circuit that converts electrical signals.

The connection portion 32 is perpendicular to, adjacent to, or angled from the one or more adaptor side areas 33. As shown in FIG. 2A, the connection portion 32 and the one or more adaptor side areas 33 form a "U" shape. The connection portion 32 and one or more adaptor side areas 33 may surround, define, or be adjacent to the adaptor receiving area 24. In alternative embodiments, the connection portion 32 and the one or more adaptor side areas 33 may form other shapes, such as an "L" shape or a half-circle shape. For insertion of the adapter 30 and blade 40, a guide 41 of the blade connects with a guide 26 of the chassis 21, another guide 41 of the blade 40 connects with a guide 36 of the adaptor 30, and a guide 35 of the adaptor 30 connects with a guide 26 of the chassis 21.

The connection portion 32 and/or one or more adaptor side areas 33 may include conductive material, such as a metal. The conductive material may be used to electrically ground or electrically connect the adaptor 30 to the chassis 21 and/or blade 40. Alternatively, or in addition to, the connection portion 32 and/or one or more adaptor side areas 33 may include a non-conductive material, such as plastic.

The connection portion 32 may include one or more connectors. For example, as shown in FIG. 2B, the connection area 32 may include connector 38 and connector 39. The connectors 38, 39 may be electrically and/or mechanically coupled with one or more other connectors. For example, the connecter 38 may be electrically and/or mechanically coupled with the connector 25 of the chassis 21. The connector 39 may be electrically and/or mechanically coupled with the connector 42 of the blade 40. The connector 38 may be mechanically and/or electrically coupled with the connector 39. The connector 38 may be directly or indirectly connected to the connector 39 using, for example, a wire, wireless device, electrical circuit, or coupling. For example, the connectors 38, 39 may be connected through an electrical circuit, which prepares electrical signals being transmitted from/to the blade 40 and/or the router 20. Preparation may include conversion, transformation, signal processing, or signal routing.

The connectors 38, 39 may be male, female, or neutral components. For example, the connector 38 may be a male component that connects to a female connector 25. In another example, the connector 39 is a female component that connects to a male connector 42. Alternatively, or in addition to, the side areas 23 may include the connectors 38, 39.

Figure 6:
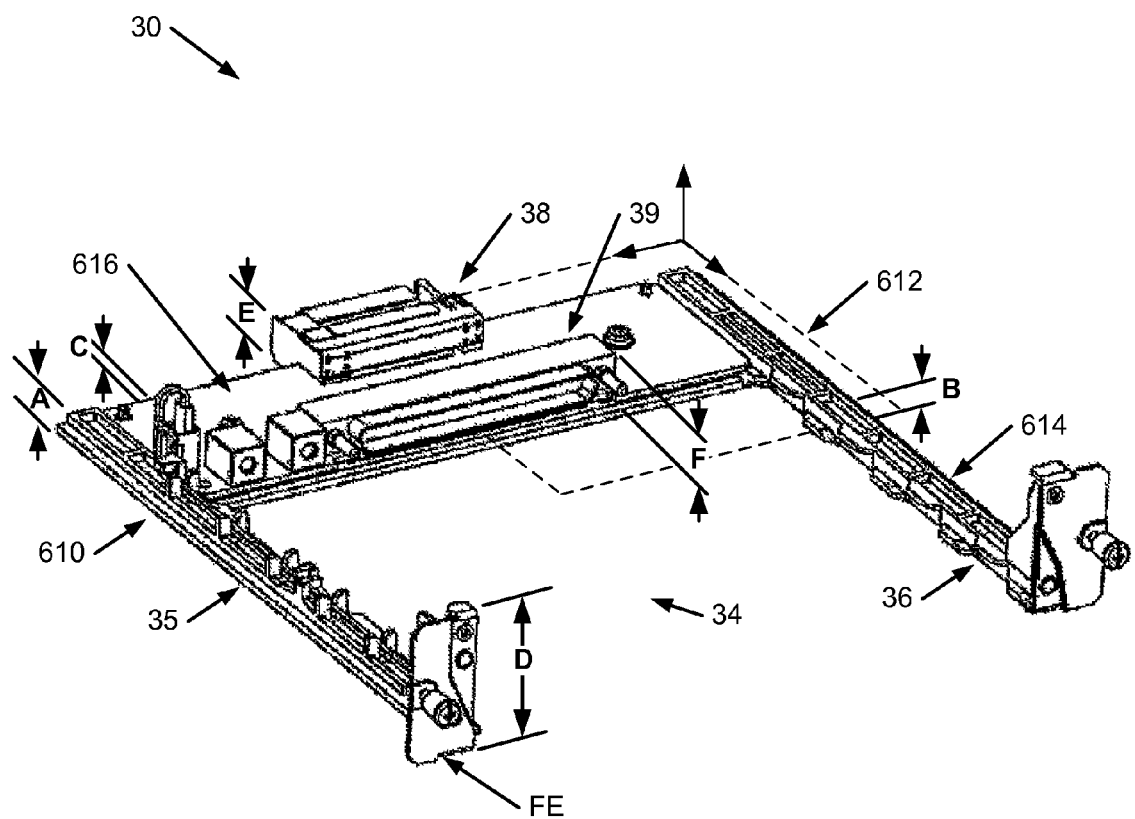
FIG. 6 illustrates another embodiment of a connection system.

As shown in FIG. 3, the one or more side areas 33 may include one or more outer adaptor guides 35. The one or more outer adaptor guides 35 may be disposed on all, some, or none of an outer edge of the one or more side areas 33. The one or more outer adaptor guides 35 may support or engage with the chassis 21. For example, an outer adaptor guide 35 may engage a chassis guide 26. The one or more outer adaptor guides 35 may be male, female, or neutral components. For example, the outer adaptor guide 35 may be a male component that engages (e.g., slides into or rolls inside of) a female chassis guide 26. Alternatively, a first outer adaptor guide 35 may be a male component and a second outer adaptor guide 35 may be a female component. As shown in FIG. 6, an outer adaptor guide 35 may be a longitudinal guide extending along a first side portion 610, or arm, of the adaptor and may engage a first chassis guide of the router chassis. The first side portion 610 may extend from a planar axis 612 of the router blade to a first height "A." A second longitudinal guide may extend along a second side portion 614, or arm, of the adaptor and may engage a second chassis guide of the router chassis. The second side portion 614 may extend from the planar axis 612 of the router blade to a second height "B." The planar axis 612 of the router blade may be a plane defined by a bottom surface or top surface of the router blade, or may be defined as any plane that is parallel to a surface of the router blade.

The connection portion 32 and/or the one or more side areas 33 may be sized such that the adaptor 30 engages with one or more chassis guides 26. For example, as shown in FIG. 3, the adaptor 30 may be sized such that the distance X2 is equal to or approximately equal to the distance X1. In the illustration above, the width of the adaptor is approximately 10 inches, such that the adaptor engages with the replacement router. For example, as shown in FIG. 6, the connection portion may include a support member 616 that extends substantially perpendicular to the first side portion 610 and the second side portion 620 to a third height "C."

The one or more adaptor side areas 33 may include one or more inner adaptor guides 36. The one or more inner adaptor guides 36 may be disposed on all, some, or none of an inner edge of the one or more adaptor side areas 33. The one or more inner adaptor guides 36 may support or engage the blade 40. For example, an inner adaptor guide 36 may engage a blade guide 41. The one or more inner adaptor guides 36 may be male, female, or neutral components. For example, as shown in FIG. 6, a first inner adaptor guide 36 may be a female component that engages with a male blade guide 41. Alternatively, a first inner adaptor guide 36 may be a male component and a second inner adaptor guide 36 may be a female component.

The receiving area 34 is operable to receive a properly sized adaptor 30 or blade 40. As used herein, "sized to receive" includes sized to engage with zero, one, two, or more portions of blade 40 or another adaptor 30. For example, as shown in FIG. 3, distance X3 may be sized so that at least one inner adaptor guide 35 engages with the blade 40 (e.g., at least one blade guide 41). A distance X3 may be equal to or approximately equal to distance X4. One or more side area 33 (e.g, with distance Y3) may be sized and positioned so that a front end of the adaptor 30 is flush or almost flush with a front end of the blade 40 (e.g., distance Y3 is equal to or approximately equal to Y4). As shown in FIG. 6, for example, the front end of the adaptor 30 may include a plate, or a substantially planar element, that extends to a fourth height D. The height "D" of the substantially planar element may extend beyond the height "A" of the first side portion 610 and the height "B" of the second side portion 614.

One benefit of a receiving area 34 that is sized to receive the blade 40 and sized to engage with the router chassis 21 is that the adaptor 30 may act as intermediary device between the router 20 and blade 40. In the illustration above, the adaptor is sized to receive the original blade and sized to engage with the replacement router. The original blade may be plugged into the adaptor and the adaptor may be plugged into the replacement router. Accordingly, a replacement blade does not need to be purchased. The original blade may continue to be used with the replacement router.

The receiving area 34 may include an opening, which allows a blade 40 or another adaptor 30 to engage the connection portion 32 of the adaptor 30. Engaging the docking portion 32 may include connecting to or engaging the connector 39. The opening may be unobstructed, partially obstructed, or enclosed. For example, the receiving area 34 may include a receiving support that partially blocks the opening. In another example, the receiving area 34 may include a door that encloses the receiving area 34. The door may be opened (e.g., when inserting or removing another adaptor 30 and/or a blade 40) and closed (e.g., once the other adaptor 30 and/or the blade 40 are inserted or removed).

Figure 2C:
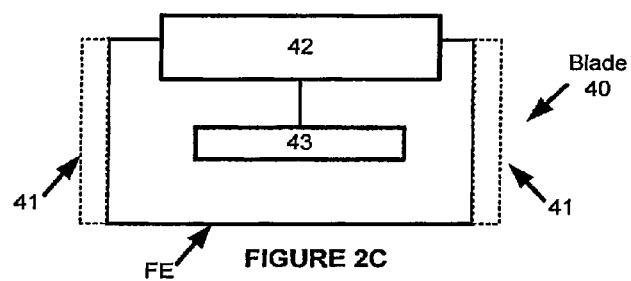
FIG. 2C illustrates one embodiment of a blade.

As shown in FIG. 2C, the network blade 40 includes one or more blade guides 41, a connector 42, and a blade circuit 43. The connector 42 may be coupled with the blade circuit 43. Additional, different, or fewer components may be provided. The network blade 40 is a module (e.g., a universal router module), a blade (e.g., an IOS router blade or multi-service blade), a service panel, a printed circuit board, or other device that may be inserted into a router chassis.

The one or more blade guides 41 may be connected to or integrated with the network blade 40. The one or more blade guides 41 may support or engage the adaptor 30. For example, a blade guide 35 may engage an inner adaptor guide 36. The one or more blade guides 35 may be male, female, or neutral components. For example, the blade guide 35 may be a male component that engages (e.g., slides into or rolls inside of) a female chassis guide 26. Alternatively, a first outer adaptor guide 35 may be a male component and a second outer adaptor guide 35 may be a female component. In one embodiment, the blade guide 41 is part of the blade 40. For example, the blade 40 may be a printed circuit board (PCB). One or more portions of the PCB may act as the one or more blade guides 41. The one or more portions of the PCB may slide into a female inner adaptor guide 36.

The connector 42 may be a male or female connector 42. The connecter 42 may couple the blade circuit 43 with the connectors 38, 39, the router 20, one or more electrical components 29 of the electrical system 27, chassis 21, other component, or a combination thereof. The connector 42 may be directly or indirectly connected to the one or more blade circuits 43 using a wire, wireless device, circuit, or coupling. The connector 25 may be a male, female, or neutral component. As shown in FIG. 6, for example, a connector 38 to connect the adaptor to the chassis may extend from the support member 616 to a fifth height "E" that is greater than the height "A" of the first side portion and the height "B" of the second side portion, but less than the height "D" of the substantially planar element.

The blade circuit 43 may be a general integrated circuit, application specific integrated circuit (ASIC) or other electrical circuit providing port technologies or services. For example, the blade circuit 43 may allow for local area network (LAN), metropolitan area network (MAN), and wide area network (WAN) port technologies. In another example, the blade circuit 43 may provide router services, such as caching, voice-over-IP (VoIP), video, and security services.

Figure 8:
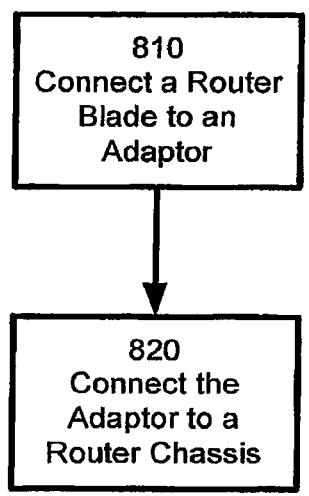
FIG. 8 illustrates one embodiment of a method for connecting a router blade to a router.

FIG. 8 shows one embodiment of a method for connecting a router blade to a router. The method is implemented using the system 100 of FIG. 1 or a different system. The acts may be performed in the order shown or a different order. The acts may be performed automatically, manually, or the combination thereof.

As shown in the exemplary embodiment of FIG. 8, the method may include connecting a router blade to an adaptor 810 and connecting the adaptor to a router 820. In alternative embodiments, additional, different, or fewer acts may be provided. For example, the method may include confirming that the router blade is mechanically and/or electrically connected to the router. The acts may be performed simultaneously, in the order shown, or a different order. For example, act 820 may be performed prior to act 810.

In act 810, a router blade is coupled with an adaptor. The router blade may be plugged into the adaptor. The adaptor is sized to receive the router blade, such that the router blade engages with the adaptor. For example, the outer edges of a router blade may be inserted into a female component of the adaptor. The router blade may be inserted until a router blade connector connects with a first adaptor connector. In act 820, the adaptor is connected to a router. The adaptor, with or without the router blade, may be plugged into a router chassis. For example, all, some, or none of one or more side areas of the adaptor may be inserted into a female component of the router chassis. The adaptor may be inserted until a second adaptor connector is coupled with a router connector, which is coupled with an electrical system of the router. The adaptor may be locked into place.

Figure 9:
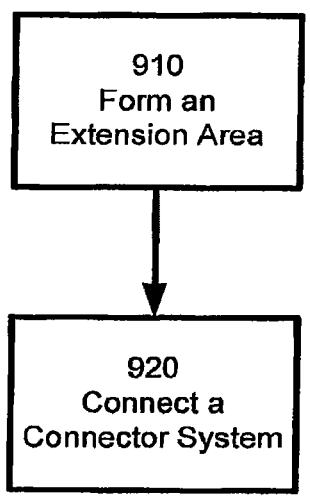
FIG. 9 illustrates one embodiment of a method for forming an adaptor.

FIG. 9 shows one embodiment of a method 900 for manufacturing an adaptor that connects a router blade to a router. The acts may be performed simultaneously, in the order shown, or a different order. For example, acts 910 and 920 may be performed using a molding process, die-cast process, or sheet metal fabrication process. The acts may be performed automatically, manually, or the combination thereof.

As shown in the exemplary embodiment of FIG. 9, the method 900 may include forming an extension area 910 and connecting a connector system to the connection area 920. Additional, different, or fewer acts may be provided.

In act 910, as shown in FIG. 5A, an extension area 510 of an adaptor is formed. As used herein, "formed" may include molded, shaped, produced, carved, cut, or other production process. Act 910 may include forming a connection area, forming a chassis edge, and forming a blade edge. Additional, different, or fewer acts may be provided.

As shown in FIG. 5A, a connection area 550 may be formed. The connection area 550 may be sized to receive a connector system.

In act 910, a chassis side 530 of the adaptor may be formed. The chassis side 530 is sized to engage a router chassis. A first outer adaptor guide may be formed on a first outer edge of the adaptor and forming a second outer adaptor guide on a second outer edge of the adaptor. In one embodiment, the first outer adaptor guide and second outer adaptor guide may be male components and operable to slide into a female component of the router chassis. In an alternative embodiment, the first outer adaptor guide and second outer adaptor guide are female components. A third outer edge may be formed perpendicular or substantially perpendicular to the first and second edges. The first connector 570 of the connector system may be provided at or near the third edge, so that the first connector 570 may connect to the router chassis.

Act 910 may include forming a blade side 540 of the adaptor. The blade side may be sized to engage a router blade. The blade side includes forming a third outer edge that is substantially perpendicular to the first outer edge and second outer edge. As shown in FIG. 5B, forming a blade side 540 may include forming a first inner adaptor guide on a first inner edge of the adaptor and forming a second inner adaptor guide on a second inner edge of the adaptor. The first inner adaptor guide and second inner adaptor guide may be male or female components and may be operable to receive all, some, or none of the router blade. Forming the blade side 540 may include forming a third inner edge that is substantially perpendicular to the first inner edge and second inner edge.

The extension area 510 may be sized and shaped to receive a router blade and sized and shaped to engage with a router chassis. The extension area 510 may be an extension for the router blade.

In act 920, a connector system 560 may be connected to a connection area 550 of the extension portion 510. As shown in FIG. 5B, the connection area 550 may be operable to receive a connector system 560 that couples a router chassis with the router blade. The connector system may include a first connector 570 and a second connector 580. The first connector 570 is operable to couple an electrical circuit of the router chassis or router with the second connector 580. The second connector 580 is operable to couple an electrical circuit of the router blade with the first connector 570. The first connector 570 is coupled with the second connector 580. The connection area may be disposed in an docking portion of the adaptor.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

We claim:

1. An adaptor for coupling a router blade to a router chassis, the adaptor comprising:
   a first longitudinal guide extending along a first side portion of the adaptor and sized to engage a first chassis guide of the router chassis along the first longitudinal guide, the first side portion extending substantially perpendicular to a planar axis of the router blade to a first height;
   a second longitudinal guide extending along a second side portion of the adaptor and sized to engage a second chassis guide of the router chassis along the second longitudinal guide, the second side portion extending substantially perpendicular to the planar axis of the router blade to a second height;
   a support member extended from the first side portion to the second side portion parallel to the planar axis of the router blade and configured to provide support to the router blade, the support member also extending substantially perpendicular to the first side portion and the second side portion to a third height;
   a receiving area comprising an opening sized to receive the router blade between the first side portion and the second side portion;
   a front end plate coupled to at least one of the first side portion or the second side portion, the front end plate having a fourth height extending beyond the first height and the second height, the front end plate at least partially obstructing the opening of the receiving area; and
   a connector system configured to electrically couple the router blade with the router chassis, wherein the connector system converts a first type of electrical signal to a second type of electrical signal and includes a first connector to connect the adaptor to the router chassis, the first connector coupled with and extending away from the support member to a fifth height greater than the first height and the second height, and less than the fourth height.

2. The adaptor of claim 1, wherein the connector system further includes a second connector to connect to the router blade, wherein the second connector is coupled with and extends away from the support member to a height greater than the first height and the second height, and less than the fourth height.

3. The adaptor of claim 1, wherein the height of the support member is less than the fifth height and the router blade and the router chassis are separated by a gap determined by a difference between the first height and the fourth height.

4. The adaptor of claim 1, wherein at least one of the first longitudinal guide and the second longitudinal guide includes a male component and the router chassis includes at least one corresponding female component.

5. The adaptor of claim 1, wherein at least one of the first longitudinal guide and the second longitudinal guide includes a female component and the router chassis includes at least one corresponding male component.

6. The adaptor of claim 1, wherein the connector system is configured to electrically couple a blade electrical circuit with a router electrical circuit and the first longitudinal guide or the second longitudinal guide is electrically coupled to the router chassis to provide a ground to the router blade.

7. The adaptor of claim 1, wherein the first longitudinal guide and the second longitudinal guide are integrally formed as part of the support member.

8. The adaptor of claim 1, wherein the router blade is a printed circuit board having a component mounted thereon and extending away from the printed circuit board to a height greater than the first height of the first side portion of the adaptor and less than the fourth height of the front end plate.

9. The adaptor of claim 1, further comprising a fastener to couple the front end plate of the adaptor to an outer surface of the router chassis.

10. The adaptor of claim 9, wherein the fastener is a screw or a bolt.

11. A method for connecting a router blade to a router, the method comprising:
    receiving first signals of network port services from the router blade using a blade connector of an adaptor, the blade connector extending substantially perpendicular to a planar axis of the router blade to a first height;
    transmitting second signals of network port services to a router chassis of the router using a chassis connector of the adaptor, the chassis connector extending substantially perpendicular to the planar axis of the router blade to a second height;
    receiving support for the adaptor on a chassis side of the adaptor, wherein support for the adaptor is provided by the router chassis engaging the adaptor at a first outer adaptor guide extending along a first outer edge of the adaptor and engaging a second outer adaptor guide extending along a second outer edge of the adaptor, and wherein the first outer edge extends substantially perpendicular to the planar axis of the router blade to a third height less than the first height and the second height, and the second outer edge extends substantially perpendicular to the planar axis of the router blade to a fourth height less than the first height and the second height; and
    receiving a fastener in a front end of the adaptor to couple the adaptor to the router chassis, the front end of the adaptor coupled to at least one of the first outer edge or the second outer edge and extending substantially perpendicular to the first outer edge and the second outer edge to a fifth height greater than the first height and the second height.

12. The method of claim 11, wherein the first outer adaptor guide and second outer adaptor guide are male components and operable to slide along a female component of the router chassis.

13. The method of claim 11, further comprising:
converting the first signals of network port services received at a first port to the second signals of network port services transmitted to a second port.

14. An adaptor for a router blade, the adaptor comprising:
a first longitudinal guide configured to slidably engage a first longitudinal adaptor guide of a router chassis on a first side portion of the adaptor, the first longitudinal guide including a protrusion or a recessed channel extending along the first side portion and the first side portion extending to a first height substantially perpendicular to the first longitudinal guide;
a second longitudinal guide configured to slidably engage a second longitudinal adaptor guide of the router chassis on a second side portion of the adaptor, the second longitudinal guide including a protrusion or a recessed channel extending along the second side portion and the second side portion extending to a second height substantially perpendicular to the second longitudinal guide;
a receiving area comprising an opening sized to receive the router blade, the opening being at least partially obstructed by a front end of the adaptor, and the front end of the adaptor extending substantially perpendicular to a planar axis of the router blade to a third height greater than the first height and the second height;
a first electrical connector configured to electrically couple the router chassis with the adaptor using a first format of networking signals, wherein the first electrical connector extends to a fourth height greater than the first height and the second height; and
a second electrical connector configured to electrically couple the adaptor with the router blade using a second format of networking signals, wherein the second electrical connector extends to a fifth height greater than the first height and the second height, and the first electrical connector is a different size than the second electrical connector.

15. The adaptor of claim 14, wherein the adaptor is coupled with the router blade by an integrated circuit on the router blade, and wherein the integrated circuit is operable to provide a router service through the adaptor to a router connected to the router chassis, the router service using the second format of networking signals.

16. The adaptor of claim 14, wherein the first longitudinal guide and the second longitudinal guide are integrally formed as part of a support member of the adaptor.

17. The adaptor of claim 16, wherein the adaptor provides all support for the router blade.

18. The adaptor of claim 16, wherein the support member of the adaptor contacts the router blade over a surface between the first longitudinal guide and the second longitudinal guide.

19. The adaptor of claim 14, wherein the router blade is a printed circuit board having a component mounted thereon and extending to a height greater than the first height of the first side portion of the adaptor and less than the fourth height of the front end.

20. The adaptor of claim 14, further comprising a fastener to couple the front end of the adaptor to an outer surface of the router chassis such that the front end of the adaptor is substantially parallel to the outer surface of the router chassis.

* * * * *